(12) United States Patent
Shibata et al.

(10) Patent No.: US 9,632,263 B2
(45) Date of Patent: Apr. 25, 2017

(54) OPTO-ELECTRIC HYBRID BOARD AND METHOD OF MANUFACTURING SAME

(71) Applicant: NITTO DENKO CORPORATION, Ibaraki-shi, Osaka (JP)

(72) Inventors: Naoki Shibata, Ibaraki (JP); Yuichi Tsujita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/029,016

(22) PCT Filed: Sep. 11, 2014

(86) PCT No.: PCT/JP2014/074027
§ 371 (c)(1),
(2) Date: Apr. 13, 2016

(87) PCT Pub. No.: WO2015/064225
PCT Pub. Date: May 7, 2015

(65) Prior Publication Data
US 2016/0231520 A1    Aug. 11, 2016

(30) Foreign Application Priority Data

Oct. 31, 2013 (JP) ................................ 2013-227369

(51) Int. Cl.
*G02B 6/12* (2006.01)
*G02B 6/42* (2006.01)
(Continued)

(52) U.S. Cl.
CPC ............ *G02B 6/4245* (2013.01); *G02B 6/42* (2013.01); *G02B 6/428* (2013.01); *G02B 6/4214* (2013.01);
(Continued)

(58) Field of Classification Search
CPC .... G02B 6/43; G02B 6/4214; G02B 6/12004; G02B 6/42
See application file for complete search history.

(56) References Cited

U.S. PATENT DOCUMENTS 7,991,248 B2 *  8/2011  Matsuoka .......... G02B 6/12002
                                                    385/129
2010/0316335 A1 * 12/2010  Furuyama ............ G02B 6/1221
                                                    385/88

(Continued)

FOREIGN PATENT DOCUMENTS

JP   2004-294857 A   10/2004
JP   2007-201108 A    8/2007

(Continued)

OTHER PUBLICATIONS

International Search Report dated Dec. 2, 2014, issued in counterpart International Application No. PCT/JP2014/074027 (2 pages).

(Continued)

*Primary Examiner* — Jennifer Doan
(74) *Attorney, Agent, or Firm* — Westerman, Hattori, Daniels & Adrian, LLP

(57) ABSTRACT

In an opto-electric hybrid board according to the present invention, an electrical interconnect line and an optical element are provided on a first surface of a substrate, and an optical waveguide optically coupled to the optical element is provided on a second surface of the substrate. A reinforcement layer for reinforcing the substrate is integrally mounted on the first surface of the substrate on which the electrical interconnect line and the optical element are provided, with an adhesive layer therebetween. A connector pad part for externally electrically connecting the electrical interconnect line is provided on the second surface of the substrate on which the optical waveguide is provided. With this configuration, the reinforcement layer is mounted on the substrate (Continued)

with high strength without adverse effects exerted on the optical element and the optical waveguide.

7 Claims, 5 Drawing Sheets

(51) Int. Cl.
    *H05K 1/02*          (2006.01)
    *H05K 1/03*          (2006.01)
    *H05K 1/11*          (2006.01)
    *H05K 3/32*          (2006.01)

(52) U.S. Cl.
    CPC ......... *G02B 6/4239* (2013.01); *H05K 1/0274* (2013.01); *H05K 1/111* (2013.01); *G02B 6/4232* (2013.01); *H05K 1/0393* (2013.01); *H05K 1/117* (2013.01); *H05K 3/328* (2013.01); *H05K 2201/015* (2013.01); *H05K 2201/0108* (2013.01); *H05K 2201/0154* (2013.01); *H05K 2201/0191* (2013.01); *H05K 2201/0358* (2013.01); *H05K 2201/09481* (2013.01); *H05K 2201/09827* (2013.01); *H05K 2201/10121* (2013.01); *H05K 2201/2009* (2013.01); *H05K 2201/2054* (2013.01)

(56) References Cited

U.S. PATENT DOCUMENTS

2012/0045168 A1\*   2/2012   Uemura ............... G02B 6/1221
                                                       385/14
2012/0207438 A1    8/2012   Yu et al.
2016/0274317 A1\*   9/2016   Tsujita ................. G02B 6/4214

FOREIGN PATENT DOCUMENTS

| JP | 2012-42731 A | 3/2012 |
| JP | 2012-163739 A | 8/2012 |
| JP | 2012-168442 A | 9/2012 |

OTHER PUBLICATIONS

Notification of Transmittal of Translation of the International Preliminary Report on Patentability (Form PCT/IB/338) issued in counterpart International Application No. PCT/JP2014/074027 mailed May 12, 2016 with Forms PCT/IB/373 and PCT/ISA/237. (9 pages).

\* cited by examiner

RELATED ART

OPTO-ELECTRIC HYBRID BOARD AND METHOD OF MANUFACTURING SAME

TECHNICAL FIELD

The present invention relates to an opto-electric hybrid board including an electrical interconnect line with an optical element mounted thereon and an optical waveguide connected to the optical element, and a method of manufacturing the same.

BACKGROUND ART

With the increase in the amount of transmission information and in the variety of functions, a large number of electronic devices and the like recently having been used are configured such that an optical element including a light source such as a vertical-cavity surface-emitting laser (VCSEL), that converts electrical signals into optical signals, a photodetector such as a photodiode that converts optical signals into electrical signals, and the like is mounted on an electric wiring board, and such that an optical interconnect line such as an optical waveguide is combined with the optical element. With the decrease in the size of electronic devices and the like, the decrease in the size of wiring boards and the increase in the degree of integration thereof have been required, and flexible wiring boards that can be mounted in a limited space have been desired. An example of such flexible opto-electric hybrid boards has a configuration as shown in FIG. 7 (see PTL 1, for example). In this opto-electric hybrid board, an electrical interconnect line 3 including an electrically conductive pattern is provided on the front surface of an insulation layer 1 made of polyimide and the like, and part of the electrical interconnect line 3 serves as a pad 3a. The pad 3a is covered with a gold plated layer 4, and an optical element 5 is mounted on the gold plated layer 4. A predetermined part of the electrical interconnect line 3 which is closer to an end of the insulation layer 1 is similarly covered with the gold plated layer 4 to serve as a connector pad part 6 for external electrical connection. The electrical interconnect line 3 except the pad 3a and the connector pad part 6 is covered with a coverlay 7, and is insulated and protected by the coverlay 7.

An optical waveguide W including an under cladding layer 9, a core 10, and an over cladding layer 11 is provided on the back surface (surface opposite from the surface where the electrical interconnect line 3 is formed) of the insulation layer 1. This optical waveguide W includes a mirror part 12 that reflects light to couple the optical axis of light L passing through the core 10 and the optical axis of the optical element 5 mounted on the front surface of the insulation layer 1. A reinforcement layer 13 made of metal, resin and the like is provided on the back surface of the insulation layer 1, with an adhesive layer 14 therebetween, to prevent an excessive force from being applied to the periphery of the portion mounted with the optical element 5 during handling.

RELATED ART DOCUMENT

Patent Document

PTL 1: JP-A-2012-42731

SUMMARY OF INVENTION

The mounting of the optical element 5 is conventionally performed by wire bonding and soldering. However, the mounting of the optical element 5 by means of ultrasonic flip chip bonding has been recently often used for the reason that the ultrasonic flip chip bonding is free from contamination of the surroundings with flux that assists in soldering and bonding and is nigh in positioning accuracy. However, it has turned out that, when the mounting of the optical element 5 is performed using ultrasonic waves, with the reinforcement layer 13 bonded to the back surface of the insulation layer 1 in the aforementioned manner, there are cases in which small leftward and rightward vibrations caused by the ultrasonic waves create distortion in the adhesive layer 14 having low elasticity resulting in insufficient mounting strength. Also, it can be contemplated that the adhesion strength of the adhesive layer 14 itself decreases, so that the reinforcement layer 13 is liable to be removed.

Further, when the mounting of the optical element 5 is performed by soldering, it is necessary that the reinforcement layer 13 is bonded firmly by the application of heat and pressure for the purpose of suppressing the production of microvoids in a reflow step. However, it has also been found that the application of heat and pressure during the bonding causes the adhesive layer 14 to enter the mirror part 12 of the optical waveguide W because of the provision of the optical waveguide W near the reinforcement layer 13, which might influence the angle of reflection of light.

To avoid these problems, the mounting of the optical element 5 is performed first, and the reinforcement layer 13 is thereafter bonded into empty space with a double-sided adhesive tape and the like by utilizing the space where the optical waveguide W is not formed. This method, however, is disadvantageous in that the reinforcement layer 13 is not firmly bonded to the insulation layer 1, so that air, vaporized solvent components and the like remaining at the interface therebetween are not sufficiently removed. Thus, this method cannot solve the problem that voids are liable to be produced when there is a subsequent reflow step.

In view of the foregoing, it is therefore an object of the present invention to provide an excellent opto-electric hybrid board which is configured to prevent the production of voids and the like because a reinforcement layer is bonded with high strength and which does not give rise to the decrease in adhesion strength even when an optical element is ultrasonically mounted, and a method of manufacturing the same.

To accomplish the aforementioned object, a first aspect of the present invention is an opto-electric hybrid board comprising: a substrate; an electrical interconnect line provided on a first surface of the substrate; an optical element provided on the first surface of the substrate and electrically connected to the electrical interconnect line; a reinforcement layer for reinforcing the substrate, the reinforcement layer being integrally mounted on the first surface of the substrate, with an adhesive layer therebetween; an optical waveguide provided on a second surface of the substrate and optically coupled to the optical element, the second surface being a surface opposite to the first surface; and a connector pad part for externally electrically connecting the electrical interconnect line, the connector pad part being provided on the second surface of the substrate.

In particular, a second aspect of the present invention is the opto-electric hybrid board wherein the reinforcement layer includes a part integrally mounted on the substrate surface, with the adhesive layer therebetween, and a cover part extending toward the optical element and covering an upper surface of the optical element. In particular, a third aspect of the present invention is the opto-electric hybrid board wherein the optical element is mounted on a predetermined part of the electrical interconnect line by ultrasonic flip chip bonding.

A fourth aspect of the present invention is a method of manufacturing an opto-electric hybrid board as recited in the first aspect. The method comprises the steps of: preparing a substrate; forming an electrical interconnect line on a first surface of the substrate; forming a connector pad part for externally electrically connecting the electrical interconnect line on a second surface of the substrate, the second surface being a surface opposite to the first surface; forming an optical waveguide on the second surface of the substrate; mounting a reinforcement layer for reinforcing the substrate under pressure with an adhesive layer therebetween on the first surface of the substrate, which is provided with the electrical interconnect line, the connector pad part and the optical waveguide; and mounting an optical element on an electrical interconnect, line of the substrate, which is provided with the reinforcement layer.

A fifth aspect of the present invention is a method of manufacturing an opto-electric hybrid board as recited in the first or second aspect. The method comprises the steps of: preparing a substrate; forming an electrical interconnect, line on a first surface of the substrate; forming a connector pad part for externally electrically connecting the electrical interconnect line on a second surface of the substrate, the second surface being a surface opposite to the first surface; forming an optical waveguide on the second surface of the substrate; mounting an optical element on the electrical interconnect line of the substrate; and mounting a reinforcement layer for reinforcing the substrate under pressure with an adhesive layer therebetween on the first surface of the substrate, which is provided with the electrical interconnect line, the connector pad part, the optical waveguide, and the optical element.

In particular, a sixth aspect of the present invention is the method of manufacturing an opto-electric hybrid board, wherein the optical element is mounted on a predetermined part of the electrical interconnect line by ultrasonic flip chip bonding in the step of mounting the optical element on the electrical interconnect line of the substrate.

In the conventional opto-electric hybrid board, the electrical interconnect line and the connector pad part for externally electrically connecting the electrical interconnect line are provided on one surface of the substrate, and the reinforcement layer and the optical waveguide are provided on the opposite surface thereof. However, it is difficult for the conventional opto-electric hybrid board to firmly bond the reinforcement layer by the application of heat and pressure before the mounting of the optical element. The present structure has broken the bounds of the common technical practice, and is configured such that the connector pad part is provided on the surface opposite from the surface where the electrical interconnect line is provided.

The present structure prevents air, vapor and the like from remaining on the bonding surface to prevent the production of voids in the subsequent reflow step and the like, because the reinforcement layer can be firmly bonded by the application of heat and pressure onto the substrate surface where the electrical interconnect line is provided before the mounting of the optical element. Also, the optical element can be mounted by means of the ultrasonic flip chip bonding, because a corresponding part of the second surface, the opposite surface from the surface where the optical element is supposed to be provided, does not include the adhesive layer and the reinforcement layer, when the opto-electric hybrid board is fixed during mounting process. Thus, there is no influence of distortion in the adhesive layer and the like due to vibrations of ultrasonic waves, and the optical element is mounted with high bonding strength. Further, the reinforcement layer itself maintains a good bonding state without being removed. The optical waveguide and the reinforcement layer are provided on opposite sides from each other with respect to the substrate. This provides the advantage that the optical waveguide is not adversely affected even when the reinforcement layer is bonded firmly by the application of heat and pressure.

Also, the reinforcement layer is provided on the same surface as the bulky optical element and various members so as to be clear thereof. This provides the advantage that the thickness of the whole opto-electric hybrid board is reduced as compared with the conventional opto-electric hybrid board.

In the manufacturing method according to the present invention, the substrate provided with the connector pad part and the optical waveguide on the surface opposite from the surface provided with the electrical interconnect line is fixed on an appropriate fixing means such as a suction stage for mounting of the optical element. In this state, the bonding of the reinforcement layer with the adhesive layer and the mounting of the optical element are performed successively. This provides the advantages of not only mounting the optical element with high bonding strength as mentioned above but also improving mass productivity. When necessary, the mounting of the optical element may be performed before the bonding of the reinforcement layer with the adhesive layer. Thus, the degree of flexibility in the manufacturing steps is increased. Further, the reinforcement layer is bonded by the application of heat and pressure, so that the bonding surface is firmly bonded. This prevents the production of voids in the subsequent heating step such as the reflow step as mentioned above. Therefore, the opto-electric hybrid board of excellent quality is produced with efficiency.

In particular, the opto-electric hybrid board according to the present invention wherein the reinforcement layer includes the part integrally mounted on the substrate surface, with the adhesive layer therebetween, and the cover part extending toward the optical element and covering the upper surface of the optical element is preferred because the cover part protects an upper portion of the optical element to keep the surroundings of the optical element clean.

In particular, the opto-electric hybrid board according to the present invention wherein the optical element is mounted on the predetermined part of the electrical interconnect line by ultrasonic flip chip bonding is free from contamination with flux that assists in soldering and bonding, and achieves the mounting of the optical element with high positioning accuracy. Also, this opto-electric hybrid board is not influenced by distortion in the reinforcement layer and the adhesive layer to achieve the mounting with high bonding strength. Because of the high bonding strength of the reinforcement layer, the removal of the reinforcement layer is not caused by the distortion in the bonding part due to vibrations of ultrasonic waves during the mounting of the optical element. The excellent quality of the opto-electric hybrid board is maintained for a long time, which is desirable.

DESCRIPTION OF EMBODIMENTS

Next, embodiments according to the present invention winnow be described in detail with reference to the drawings.

Figure 1:
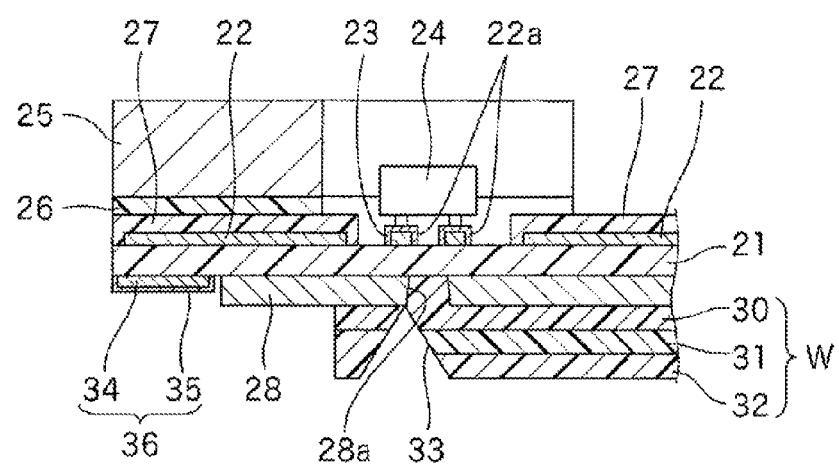
FIG. 1 is a schematic partial sectional view of an opto-electric hybrid board according to one embodiment of the present invention.

FIG. 1 shows an opto-electric hybrid board according to one embodiment of the present invention. In this opto-electric hybrid board, an electrical interconnect line 22 including an optical element mounting pad 22a is provided on the front surface of a substrate (insulation layer made of polyimide and the like) 21, and an optical element 24 is mounted on the pad 22a by ultrasonic flip chip bonding, with a gold plated layer 23 therebetween. A reinforcement layer 25 of a generally U-shaped configuration as seen in plan view is integrally bonded to the front surface of the substrate 21, with an adhesive layer 26 therebetween, and is disposed so as to surround a portion mounted with the optical element 24. The whole of the electrical interconnect line 22 except the pad 22a is covered with d protected by a coverlay 27. The adhesive layer 26 is formed over a portion where the cover lay 27 is provided and a portion where the coverlay 27 is not provided.

A metal layer 28 including an optical coupling through hole 28a is provided on the back surface (a second surface) of the substrate 21, i.e. the surface opposite from the surface (a first surface) where the electrical interconnect line 22 and the like are formed. An optical waveguide W including an under cladding layer 30, a core 31, and an over cladding layer 32 is provided on the lower surface of the metal layer 28. When the metal layer 28 is provided on the second surface of the substrate 21 as in this instance, the expression "a second surface of a substrate with an electrical interconnect line provided on a first surface thereof" is to be interpreted as including not only "the lower surface of the substrate" but also the lower surface of a layer provided on the lower surface of the substrate when the layer is present, such as "the lower surface of a metal layer provided on the lower surface of the substrate".

The under cladding layer 30 of the optical waveguide W enters and fills the interior of the through hole 28a of the metal layer 28. A mirror part 33 that is a light reflecting surface inclined at an angle of 45 degrees is formed at an end of the optical waveguide W to provide optical coupling to the optical element 24 on the front surface of the substrate 21.

The metal layer 28 on the back surface of the substrate 21 has an end portion partially removed, so that the back surface of the substrate 21 is exposed in the end portion. A connector pad part 36 including an electrically conductive layer 34 similar to the electrical interconnect line 22 and a gold plated layer 35 covering the electrically conductive layer 34 is provided on the exposed portion of the back surface of the substrate 21. This connector pad part 36 is electrically connected to the electrical interconnect line 22 on the front surface of the substrate 21 through a through hole (not shown) in the thickness direction. Power is applied to the opto-electric hybrid board by connecting a connector having an electrical interconnect line extending from an external power source to the connector pad part 36. Although not shown in FIG. 1, the right half of the opto-electric hybrid board has a structure symmetrical to that of the left half thereof shown in the figure (which will not be described; the same applies to the subsequent figures).

Figure 2A:
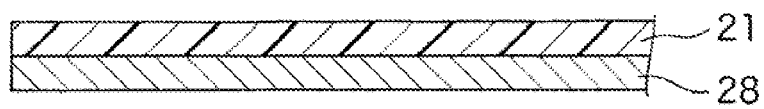
FIGS. 2A to 2F are schematic illustrations showing the steps of producing the opto-electric hybrid board.

The opto-electric hybrid board is manufactured, for example, in a manner to be described below. As shown in FIG. 2A, the flat metal layer 28 is initially prepared. Examples of a material for the formation of the metal layer 28 include stainless steel, copper, silver, aluminum, nickel, chromium, titanium, platinum and gold. Stainless steel is preferable from the viewpoints of strength, bending resistance and the like. It is preferable that the metal layer 28 has a thickness generally in the range of 10 to 200 μm.

Then, a photosensitive insulating resin is applied to the front surface of the metal layer 28 to form an insulation layer having a predetermined pattern by a photolithographic process. This insulation layer is the substrate 21. It is preferable that the substrate 21 has a thickness generally in the range of 3 to 50 μm. It is desirable that the substrate 21 has transparency so as to provide optical coupling between the optical element 24 to be provided on the front surface of the substrate 21 and the optical waveguide W. Polyimide resins and the like are preferably used for the substrate 21. In particular, fluorine-based polyimide resins having high transparency are more preferably used. When the substrate 21 used herein is opaque, it is necessary that a through hole for optical coupling is formed in the substrate 21 as in the metal layer 28.

Figure 2B:
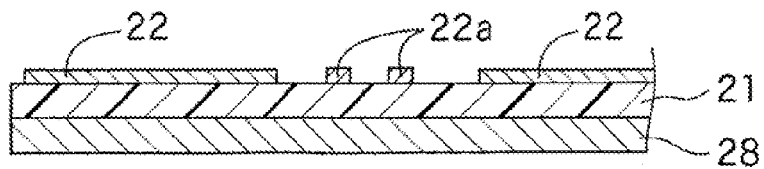

Next, as shown in FIG. 2B, the electrical interconnect line 22 including the optical element mounting pad 22a is formed on the front surface of the substrate 21, for example, by a semi-additive process. Specifically, a metal film (not shown) made of copper and the like is formed on the front surface of the substrate 21 by sputtering, electroless plating or the like. This metal film serves as a seed layer (a layer serving as a basis material for the formation of an electroplated layer) for a subsequent electroplating process. Then, a dry film resist is affixed to the opposite surfaces of a laminate comprised of the substrate 21 and the seed layer. Thereafter, a photolithographic process is performed to form a hole having the pattern of the electrical interconnect line 22 in the dry film resist on the side where the seed layer is formed, so that a surface portion of the seed layer is uncovered at the bottom of the hole.

Then, electroplating is performed to form an electroplated layer made of copper (having a thickness on the order of 3 to 30 μm) in a stacked manner on the surface portion of the seed layer uncovered at the bottom of the hole. Then, the dry film resist is stripped away using a sodium hydroxide aqueous solution and the like. Thereafter, a portion of the seed layer on which the electroplated layer is not formed is removed by soft etching. A laminate portion comprised of the remaining electroplated layer and the underlying seed layer becomes the electrical interconnect line 22. Although copper is used in this instance as a material for the formation of the electrical interconnect line 22, metal materials excellent in electrical conductivity and in ductility such as chromium, aluminum, gold, and tantalum in addition to copper are preferably used.

Figure 2C:
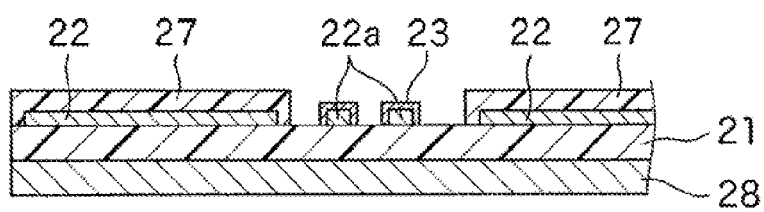

Next, an electroless plated layer made of nickel and the like (not shown) is formed on the front surfaces of the electrical interconnect line 22. Thereafter, as shown in FIG. 2C, a photosensitive insulating resin including a polyimide resin and the like is applied to part of the electrical interconnect line 22 except the optical element mounting pad 22a to form the coverlay 27 by a photolithographic process. It is preferable that the coverlay 27 has a thickness in the range of 1 to 20 μm. The coverlay 27 having a thickness in the aforementioned range produces an excellent function of protecting the electrical interconnect line 22. Then, the electroless plated layer (not shown) formed on the pad 22a included in the electrical interconnect line 22 is removed by etching. Thereafter, an electroplated layer 23 made of gold, nickel and the like (in this instance, gold plated layer) is formed at a site where the electroless plated layer is removed.

Figure 2D:
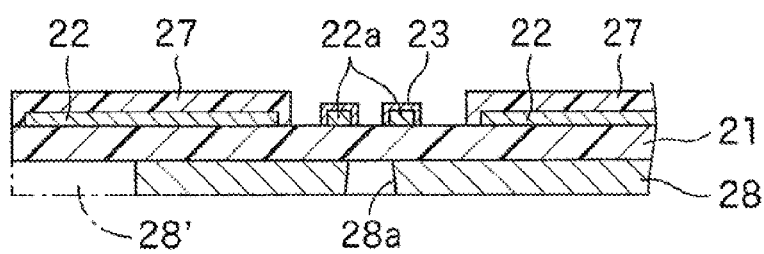

Next, as shown in FIG. 2D, the optical coupling through hole 28a and a cut-out part 28' for the formation of the connector pad part 36 are formed by etching and the like in predetermined positions of the metal layer 28 on the back surface of the substrate 21. Specifically, a dry film resist is initially affixed to the opposite surfaces of a laminate comprised of the metal layer 28, the substrate 21, the electrical interconnect line 22 and the like. Thereafter, a photolithographic process is performed to form holes having the pattern of the through hole 28a and the cut-out part 28' in the dry film resist on the side where the metal layer 28 is formed, so that back surface portions of the metal layer 28 are uncovered at the bottoms of the holes. Then, the portions of the metal layer 28 uncovered in the holes are removed by etching using an aqueous etching solution depending on the material of the metal layer 28 (for example, an aqueous ferric chloride solution for stainless steel), so that the through hole 28a and the cut-out part 28' are formed.

Figure 2E:
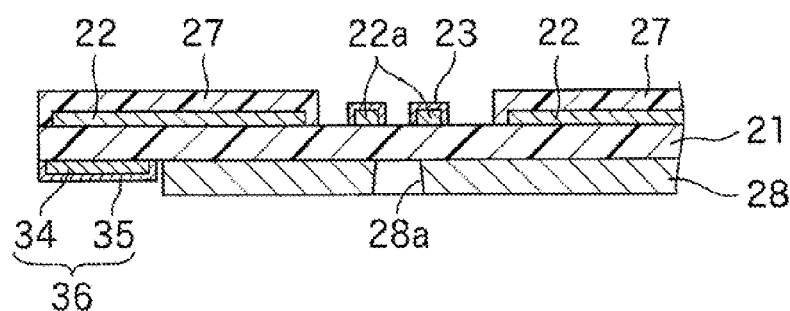
Figure 2F:
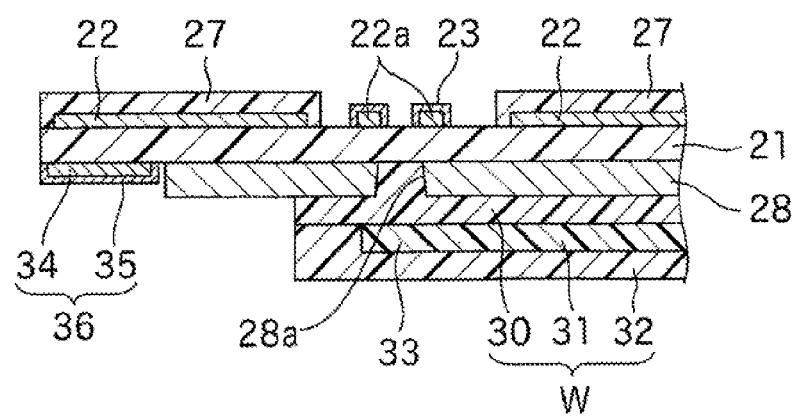

Next, as shown in FIG. 2E, the connector pad part 36 configured such that the electrically conductive layer 34 is covered with the gold plated layer 35 is formed in the cut-out part 28' of the metal layer 28 in a manner similar to that of the aforementioned formation of the electrical interconnect line 22 and the pad 22a. At this time, a through hole for electrical connection between the electrical interconnect line 22 on the front surface of the substrate 21 and the connector pad part 36 is also formed (not shown).

Next, as shown in FTG. 2F, the optical waveguide W is formed on the back surface of the metal layer 28. Specifically, a photosensitive resin which is a material for the formation of the under cladding layer 30 is applied to the back surface of the metal layer 28 (the back surface of the substrate 21 in a portion where the metal layer 28 is not formed). Thereafter, the applied layer is exposed to irradiation light. This exposure cures the applied layer to form the under cladding layer 30. It is preferable that the material for the formation of the under cladding layer 30 has transparency so as to provide optical coupling between the optical element 24 on the front surface of the substrate 21 and the optical waveguide W. The material for the formation of the under cladding layer 30 enters and fills the interior of the optical coupling through hole 28a of the metal layer 28. It is preferable that the under cladding layer 30 has a thickness (thickness as measured from the back surface of the metal layer 28) in the range of 1 to 50 μm. The under cladding layer 30 may be formed by patterning into a predetermined pattern by a photolithographic process.

Next, the core 31 having a predetermined pattern is formed on the front surface (the lower surface as seen in the figure) of the under cladding layer 30 by a photolithographic process. It is preferable that the core 31 has a thickness in the range of 5 to 100 μm. It is preferable that the core 31 has a width in the range of 5 to 100 μm. An example of a material for the formation of the core 31 includes a photosensitive similar to that for the under cladding layer 30, and the material used herein has a refractive index higher than that of the materials for the formation of the aforementioned under cladding layer 30 and the over cladding layer 32 to be described below. The adjustment of the refractive indices may be made, for example, by considering the selection of the types of the materials for the formation of the under cladding layer 30, the core 31 and the over cladding layer 32, and the composition ratio thereof.

Next, the over cladding layer 32 is formed on the front surface (the lower surface as seen in the figure) of the under cladding layer 30 by a photolithographic process so as to cover the core 31. The over cladding layer 32 has a thickness (as measured from the front surface of the under cladding layer 30) not less than that of the core 31 and preferably in the range of 10 to 2000 μm. An example of a material for the formation of the over cladding layer 32 includes a photosensitive resin similar to that for the under cladding layer 30. For the formation of the over cladding layer 32, patterning may be performed to form a predetermined pattern by a photolithographic process.

Figure 3A:
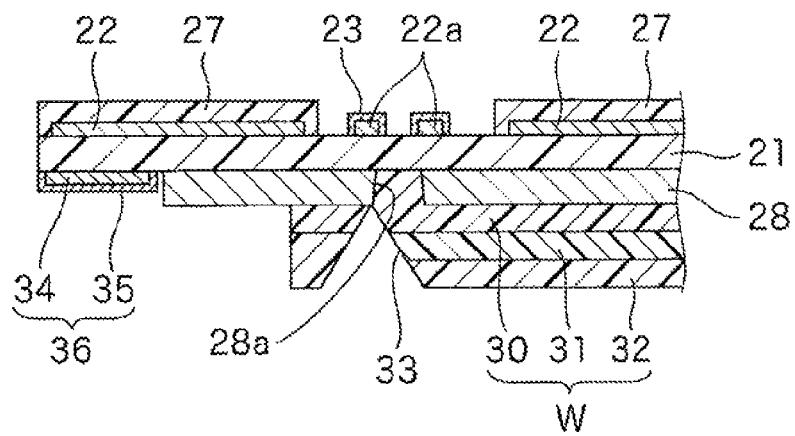
FIGS. 3A and 3B are schematic illustrations showing the steps of producing the opto-electric hybrid board.

Then, part of the optical waveguide W thus obtained which corresponds to the pad 22a provided on the front surface of the substrate 21 is formed into an inclined surface inclined at 45 degrees with respect to the longitudinal direction of the core 31 by laser beam machining, cutting and the like, as shown in FIG. 3A, to provide the mirror part 33.

Figure 3B:
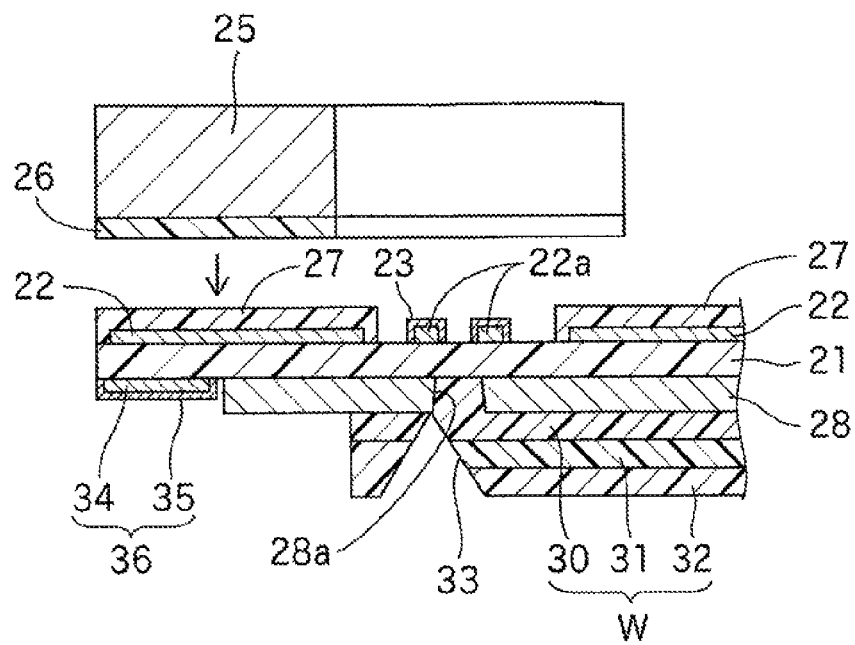

Next, a laminate thus obtained (a laminate including the substrate 21, the electrical interconnect line 22 and the like provided on the front surface of the substrate 21, and the optical waveguide W formed on the back surface of the substrate 21) is placed on a suction stage for mounting of an optical element, and is fixed thereon under suction. In this state, as shown in FIG. 3B, the reinforcement layer 25 of a generally U-shaped configuration, as seen in plan view, is bonded to a predetermined region around a portion where the optical element is to be mounted. Specifically, laminated sheet obtained by stacking a metal layer or a resin layer becoming the reinforcement layer 25 on the front surface of a release sheet, with the adhesive layer 26 therebetween, is prepared and punched into an intended shape. Then, the release sheet is peeled off. With the adhesive layer 26 on the lower surface of the reinforcement layer 25 exposed, the resulting laminated sheet is bonded to predetermined position of the front surface of the substrate 21 on the suction stage the application of heat and pressure.

It is preferable that the heating temperature during the bonding of the reinforcement layer 25 is in the range of 80° to 230° C. It is preferable that the pressure is in the range of 0.1 to 10 MPa. When the conditions of the application of heat and pressure all below the aforementioned ranges, the bonding strength between the reinforcement layer 25 and the substrate 21 is low, so that there is apprehension that the reinforcement layer 25 is removed in the subsequent heating step for the mounting of the optical element 24 and the like, which is undesirable. When the conditions of the application of heat and pressure exceed the aforementioned ranges, there is apprehension about adverse effects exerted on a laminate which becomes the opto-electric hybrid board, which is undesirable.

Preferred examples of a material for the formation of the reinforcement layer 25 include not only metal materials such as stainless steel, copper, silver, aluminum, nickel, chromium, titanium, platinum and gold but also resin materials such as polyimide, polyethylene terephthalate and glass epoxy resin. The reinforcement layer 25 preferably has thickness in the range 25 to 2000 μm, and more preferably in the range of 250 to 1500 μm. When the reinforcement layer 25 is too thick, the rigidity of this portion is too high, which in turn results in poor workability. When the reinforcement layer 25 is too thin, there is apprehension that a sufficient reinforcing effect is not provided.

Also, an adhesive layer exhibiting excellent adhesion to both the reinforcement layer 25 and the substrate 21 is selected as appropriate as the adhesive layer 26 for bonding the reinforcement layer 25 to the substrate 21. For example, epoxy adhesive agents, acrylic adhesive agents and the like are preferably used. The adhesive layer 26 preferably has a thickness in the range of 5 to 100 μm. When the adhesive layer 26 is too thick, there is apprehension about poor workability. When the adhesive layer 26 is too thin, there is apprehension that a sufficient adhesion strength is not provided.

Next, the optical element 24 is mounted by ultrasonic flip chip bonding onto the pad 22a on the front surface of the substrate 21 in the laminate to which the reinforcement layer 25 is bonded. In this manner, the opto-electric hybrid board shown in FIG. 1 is provided.

Examples of a method of mounting the optical element 24 include flip-chip mounting methods such as a solder reflow method and a C4 bonding method using screen printing of solder bumps and solder paste. However, the aforementioned mounting of the optical element 24 by means of ultrasonic flip chip bonding is optimum because this method allows the substrate 21 to be fixed without the intervention of the reinforcement layer 25 and the adhesive layer 26 for adhering thereto as mentioned above. The ultrasonic flip chip bonding has the advantages of being free from contamination of the surroundings with flux that assists in soldering and bonding and being high in positioning accuracy during the mounting.

In the opto-electric hybrid board thus obtained, the reinforcement layer 25 is bonded firmly by the application of heat and pressure to the surface of the substrate 21 where the electrical interconnect line 22 is provided, before the mounting of the optical element 24. Thus, air, vapor and the like do not remain on the bonding surface, and accordingly do not impair the performance. Also, a corresponding part of the second surface of the substrate 21, the opposite surface from the surface where the optical element 24 is supposed to be provided, does not include the adhesive layer 26 and the reinforcement layer 27, when the opto-electric hybrid board in fixed during mounting process. Hence, the optical element 24 in mounted by means of the ultrasonic flip chip bonding. Thus, there is no influence of distortion in the adhesive layer and the like due to vibrations of ultrasonic waves, and the optical element 24 is mounted with high bonding strength. This also allows the reinforcement layer 25 itself to maintain a good bonding state. In addition, the optical waveguide W and the reinforcement layer 25 are provided on opposite sides from each other with respect to the substrate 21. This provides the advantage that the optical waveguide W is not adversely affected even when the reinforcement layer 25 is bonded firmly by the application of heat and pressure.

The opto-electric hybrid board, in which the relatively bulky optical element 24 and the relatively bulky reinforcement layer 25 are provided on the same surface of the substrate 21, has the advantage that the thickness of the whole opto-electric hybrid board is reduced as compared with the conventional opto-electric hybrid board.

In the aforementioned method of manufacturing the opto-electric hybrid board, the substrate 21 provided with the electrical interconnect line 22, the optical waveguide W and the connector pad part 36 is fixed on the suction stage for the mounting of an optical element and the like. In that state, the reinforcement layer 25 is bonded firmly to the front surface of the substrate 21, and subsequently the optical element 24 is mounted on the same surface. Thus, this method has the advantage of being excellent in mass productivity. Depending on the circumstances, the mounting of the optical element 24 may be performed before the bonding of the reinforcement layer 25. Thus, this method has the advantage of having a high degree of flexibility in the manufacturing steps.

In addition, the reinforcement layer 25 is bonded firmly by the application of heat and pressure. This prevents air, vapor and the like from remaining on the bonding surface to accordingly prevent the production of voids and the like in the subsequent steps. Therefore, the opto-electric hybrid board of excellent quality is produced with efficiency.

Figure 4:
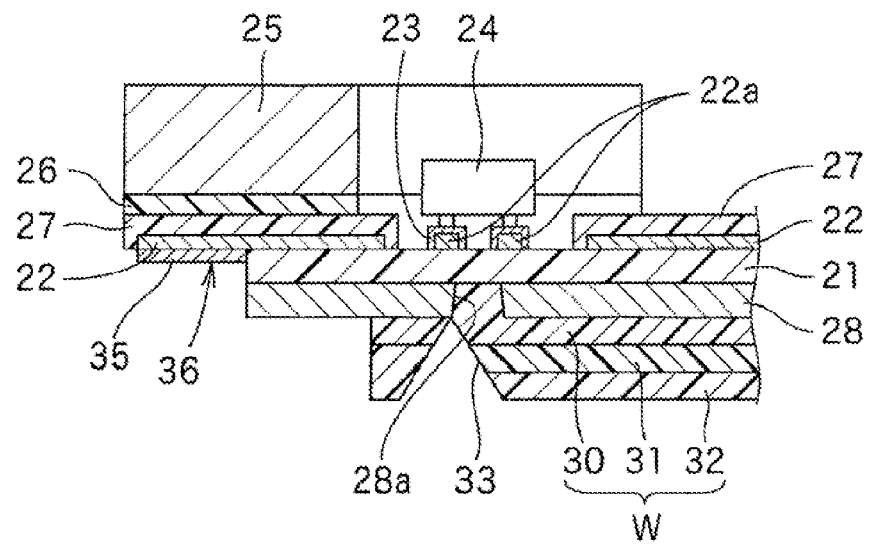
FIG. 4 is a schematic partial sectional view of the opto-electric hybrid board according to another embodiment of the present invention.

In the aforementioned instance, the end portion of the metal layer 28 on the back surface of the substrate 21 is removed and the connector pad part 36 is formed in that portion, as shown in FIGS. 2D and 2E. However, the method of forming the connector pad part 36 on the back surface of the substrate 21 is not limited to this. For example, as shown in FIG. 4, the end portion of the substrate 21 together with the metal layer 28 is removed, so that the back surface of the electrical interconnect line 22 is partially exposed downwardly. This exposed surface is covered with the gold plated layer 35, so that the connector pad part 36 is formed. This opto-electric hybrid board, in which the connector pad part 36 is provided on the opposite side of the substrate 21 from the surface where the electrical interconnect line 22 is provided, produces effects similar to those of the opto-electric hybrid board shown in FIG. 1. Therefore, this configuration shall be included in the configuration in which "the connector pad part is provided on the same side of the substrate as the optical waveguide" according to the present invention. The remaining parts, which are similar to those shown in FIG. 1, are designated by the same reference numerals and characters, and will not be described.

Figure 5:
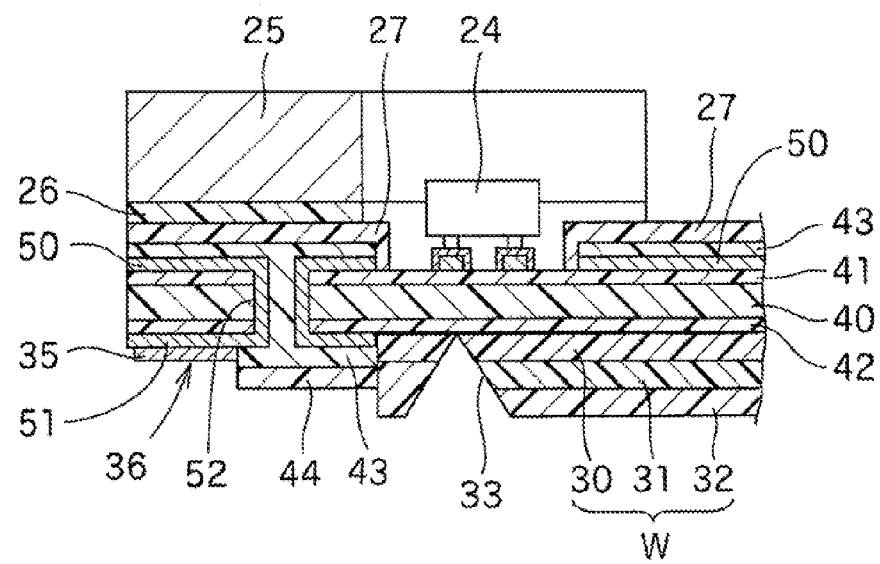
FIG. 5 is a schematic partial sectional view of the opto-electric hybrid board according to still another embodiment of the present invention.

In the aforementioned instance, the present invention is applied to the opto-electric hybrid board including the substrate 21 formed by the insulation layer and the metal layer 28 provided on the back surface of the substrate 21. The present invention, however, may have any laminated configuration on the front surface of the substrate and any laminated configuration on the back surface thereof. The effects of the present invention are achieved so long as the electrical interconnect, line and the reinforcement layer are provided on one surface of the substrate whereas the optical waveguide and the connector pad part are provided on the other surface thereof. The present invention may be applied to an opto-electric hybrid board configured such that electrical interconnect lines 50 and 51 are formed on opposite surfaces of an insulative base material 40, with adhesive layers 41 and 42 respectively therebetween, and are connected to each other through a through hole 52, and such that the optical waveguide W is provided on the back surface of the insulative base material 40, as shown in FIG. 5. Specifically, part of the electrical interconnect line 51 on the back surface of the insulative base material 40 is covered with the gold plated layer 35 to serve as the connector pad part 36, and the reinforcement layer 25 is provided on the opposite side, i.e. the front surface, of the insulative base material 40, with the adhesive layer 26 therebetween. This also produces the effects of the present invention. In FIG. 5, the reference numeral 43 designates an adhesive layer, and 44 designates a coverlay.

Figure 6:
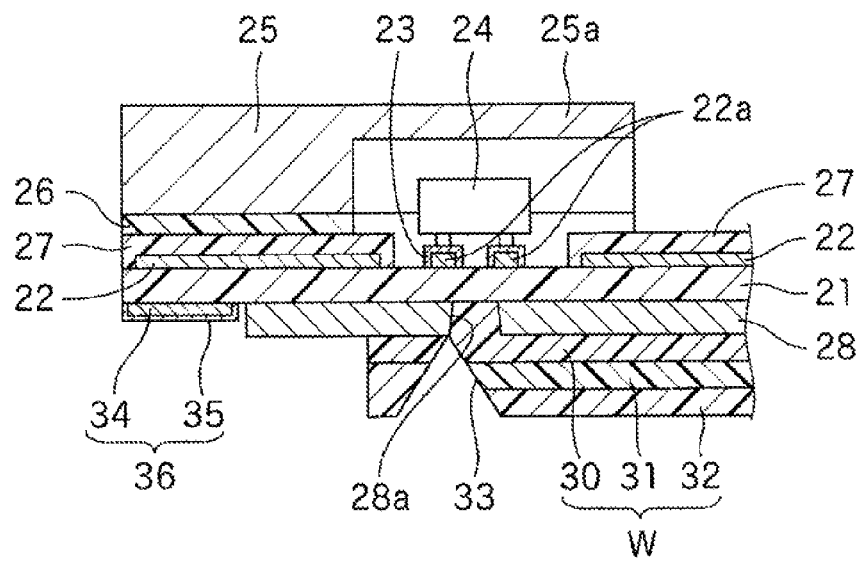
FIG. 6 is a schematic partial sectional view of the opto-electric hybrid board according to a further embodiment of the present invention.

In the present invention, the shape of the reinforcement layer 25 need not be the generally U-shape, as seen in plan view, as in the aforementioned instances, but may be a rectangular shape as seen in plan view or other various shapes. As shown in FIG. 6, part of the reinforcement layer 25 extends toward the optical element 24 to form a cover part 25a covering the upper surface of the optical element 24. The use of such a configuration is preferred because the reinforcement layer 25 protects the optical element 24 to keep the surroundings of the optical element 24 clean.

To provide the opto-electric hybrid board having the aforementioned configuration, it is necessary that the reinforcement layer 25 is bonded to the substrate 21 after the optical element 24 is mounted on the substrate 21. However, the reinforcement layer 25 provides space under the cover part 25a covering the optical element 24. This allows the bonding of the reinforcement layer 25 with sufficient strength without damage to the optical element 24.

Next, an inventive example of the present invention will be described in conjunction with a comparative example. It should be noted that the present invention is not limited to the inventive example.

EXAMPLES

Inventive Example 1

The opto-electric hybrid board having the configuration shown in FIG. 1 was produced in accordance with the aforementioned manufacturing method. ULM850-10-TT-C0104U available from ULM Photonics GmbH was mounted as a light-emitting element on one side of the substrate 21 extending in the shape of a strip, and PDCA04-70-GS available from Albis Optoelectronics AG was mounted as a light-receiving element on the other side of the substrate 21. For the bonding of the reinforcement layer 25, heating temperature was 160° C. and pressing pressure was 3 MPa.

Comparative Example 1

Figure 7:
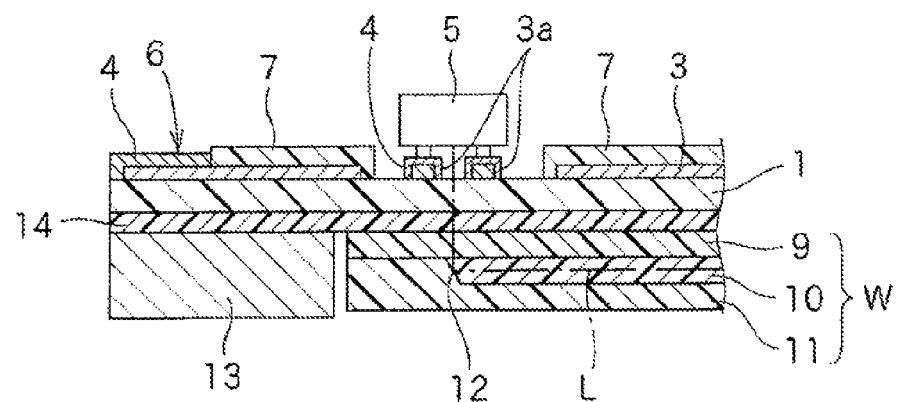
FIG. 7 is a schematic partial sectional view of an exemplary conventional opto-electric hybrid board.

The conventional opto-electric hybrid board shown in FIG. 7 was produced in accordance with the aforementioned manufacturing method. The materials, thicknesses and the like of the respective members were pursuant to the configuration of Inventive Example 1. For the bonding of the reinforcement layer 13 to the substrate 1, a double-sided adhesive tape (No. 5601 available from Nitta Denko Corporation) was used, and affixed to the substrate 1 with a human hand.

[Bonding Strength of Reinforcement Layer]

For evaluation of the bonding strengths of the reinforcement layers 25 and 13 of the respective articles produced in inventive Example 1 and Comparative Example 1, the peel strengths thereof were measured using a tensile and compression testing machine (SV-52NA-2L) available from Imada-SS Corporation. As a result, the peel strength of the article produced in Inventive Example 1 was 1.3 N/mm, and the peel strength of the article produced in Comparative Example 1 was 0.3 N/mm. It is found that the article produced in Inventive Example 1 is much better in bonding strength.

[Thickness of Opto-Electric Hybrid Board]

The article produced in inventive Example 1 has a maximum thickness of 0.9 mm of all thicknesses, whereas the article produced in Comparative Example 1 has a maximum thickness of 1.1 mm. It is found that the article produced in Inventive Example 1 is thinner to further meet the requirement for savings in space.

Although specific forms in the present invention have been described in the aforementioned examples, the aforementioned examples should be considered as merely illustrative and not restrictive. It is contemplated that various modifications evident to those skilled in the art could be made without departing from the scope of the present invention.

The present invention is widely applicable to an excellent opto-electric hybrid board which is configured to prevent the production of voids and the like because a reinforcement layer is bonded with high strength and which does not give rise to the decrease adhesion strength even when an optical element is ultrasonically mounted, and a method of manufacturing the same.

REFERENCE SIGN LIST

21 Substrate
22 Electrical interconnect line
24 Optical element
25 Reinforcement layer
26 Adhesive layer
36 Connector pad part
W Optical waveguide

The invention claimed is:

1. An opto-electric hybrid board comprising:
a substrate;
an electrical interconnect line provided on a first surface of the substrate;
an optical element provided on the first surface of the substrate and electrically connected to the electrical interconnect line;
a reinforcement layer for reinforcing the substrate, the reinforcement layer being integrally mounted on the first surface of the substrate, with an adhesive layer therebetween;
an optical waveguide provided on a second surface of the substrate and optically coupled to the optical element, the second surface being a surface opposite to the first surface; and
a connector pad part for externally electrically connecting the electrical interconnect line, the connector pad part being provided on the second surface of the substrate.

2. The opto-electric hybrid board according to claim 1, wherein the reinforcement layer includes a part integrally mounted on the substrate surface, with the adhesive layer therebetween, and a cover part extending toward the optical element and covering an upper surface of the optical element.

3. The opto-electric hybrid board according to claim 1, wherein the optical element is mounted on a predetermined part of the electrical interconnect line by ultrasonic flip chip bonding.

4. A method of manufacturing an opto-electric hybrid board according to claim 1, the method comprising the steps of:
preparing a substrate;
forming an electrical interconnect line on a first surface of the substrate;

forming a connector pad part for externally electrically connecting the electrical interconnect line on a second surface of the substrate, the second surface being a surface opposite to the first surface;

forming an optical waveguide on the second surface of the substrate;

mounting a reinforcement layer for reinforcing the substrate under pressure with an adhesive layer therebetween on the first surface of the substrate, which is provided with the electrical interconnect line, the connector pad part and the optical waveguide; and mounting an optical element on the electrical interconnect line of the substrate, which is provided with the reinforcement layer.

5. A method of manufacturing an opto-electric hybrid board according to claim 1, the method comprising the steps of:

preparing a substrate;

forming an electrical interconnect line on a first surface of the substrate;

forming a connector pad part for externally electrically connecting the electrical interconnect line on a second surface of the substrate, the second surface being a surface opposite to the first surface;

forming an optical waveguide on the second surface of the substrate;

mounting an optical element on the electrical interconnect line of the substrate; and mounting a reinforcement layer for reinforcing the substrate under pressure with an adhesive layer therebetween on the first surface of the substrate, which is provided with the electrical interconnect line, the connector pad part, the optical waveguide, and the optical element.

6. The method of manufacturing an opto-electric hybrid board according to claim 4, wherein the optical element is mounted on a predetermined part of the electrical interconnect line by ultrasonic flip chip bonding in the step of mounting the optical element on the electrical interconnect line of the substrate.

7. The method of manufacturing an opto-electric hybrid board according to claim 5, wherein the optical element is mounted on a predetermined part of the electrical interconnect line by ultrasonic flip chip bonding in the step of mounting the optical element on the electrical interconnect line of the substrate.

* * * * *